United States Patent
Maiocchi

(10) Patent No.: US 8,018,364 B2
(45) Date of Patent: Sep. 13, 2011

(54) CONTROL APPARATUS FOR A LOAD SUPPLY DEVICE

(75) Inventor: Giuseppe Maiocchi, Capiago Intimiano (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 0 days.

(21) Appl. No.: 12/646,813

(22) Filed: Dec. 23, 2009

(65) Prior Publication Data

US 2010/0156687 A1 Jun. 24, 2010

(30) Foreign Application Priority Data

Dec. 24, 2008 (IT) .............................. MI2008A2319

(51) Int. Cl.
*H03M 3/00* (2006.01)

(52) U.S. Cl. ........ 341/143; 341/118; 341/120; 341/144; 341/155; 330/10; 330/251

(58) Field of Classification Search .................. 341/118, 341/120, 143, 144; 330/10, 251
See application file for complete search history.

(56) References Cited

U.S. PATENT DOCUMENTS

| | | | | |
|---|---|---|---|---|
| 5,933,453 A * | 8/1999 | Lewison | ......................... | 375/238 |
| 6,344,811 B1 * | 2/2002 | Melanson | ..................... | 341/143 |
| 6,414,614 B1 * | 7/2002 | Melanson | ..................... | 341/143 |
| 6,504,427 B2 * | 1/2003 | Midya et al. | ..................... | 330/10 |
| 6,795,004 B2 * | 9/2004 | Masuda et al. | ................ | 341/143 |
| 7,362,082 B2 * | 4/2008 | Smidt | ........................... | 323/284 |
| 7,372,384 B1 * | 5/2008 | Xu | ................................. | 341/143 |
| 7,453,387 B2 * | 11/2008 | Lee | ................................. | 341/152 |
| 7,570,693 B2 * | 8/2009 | Mallinson et al. | ............ | 375/254 |
| 7,830,289 B2 * | 11/2010 | Ferri | ............................... | 341/143 |
| 2005/0122244 A1 * | 6/2005 | Hongoh et al. | ............... | 341/143 |
| 2006/0072657 A1 * | 4/2006 | Putzeys | ......................... | 375/238 |
| 2007/0176810 A1 * | 8/2007 | Lee | ................................. | 341/143 |

FOREIGN PATENT DOCUMENTS

| | | |
|---|---|---|
| WO | 00/55966 A1 | 9/2000 |
| WO | 2004/023645 A2 | 3/2004 |

\* cited by examiner

*Primary Examiner* — Linh V Nguyen
(74) *Attorney, Agent, or Firm* — Lisa K. Jorgenson; Seed IP Law Group PLLC; E. Russell Tarleton

(57) ABSTRACT

A control apparatus for a supply device of a load, the supply device is of switching type and connected between a supply voltage and a reference voltage, the apparatus including a sigma-delta device having an input terminal at which is present a first digital signal and adapted to provide a pulse-density modulation signal at the output terminal; the sigma-delta device including a feedback circuit capable of sending to the input terminal of the sigma-delta device a second digital signal whose value depends on the value of the output signal, and the apparatus including a device capable of digitalizing the supply voltage and of providing a further digital signal. The feedback circuit includes a terminal capable of receiving the further digital signal, and the sigma-delta device having a gain such that the output digital signal is proportional to the inverse of the further digital signal.

19 Claims, 4 Drawing Sheets

CONTROL APPARATUS FOR A LOAD
SUPPLY DEVICE

BACKGROUND

1. Technical Field

The present disclosure refers to a control apparatus for a load supply device.

2. Description of the Related Art

Control apparatuses are currently known for motors of the digital type, such as the one illustrated in FIG. 1. FIG. 1 shows a memory 1 where waveform samples WD are stored for driving a load 2, for example a load formed by the series of a resistance and an inductance. The samples WD are multiplied in amplitude by means of a digital multiplier 3, and the resulting modulated digital signals SD are inputs to a PWM digital converter 4 capable of providing pulse-width modulation signals for driving the switching device 5; the latter is connected between a supply voltage Vdd and ground GND and is responsible for supplying the motor 2.

In such control devices, the case where the average value of the signal at the output from the switching device 5 reflects the average value of the signal at the output of the PWM converter 3 occurs only when the supply voltage Vdd is kept constant.

However, in the majority of cases there are considerable variations in the supply voltage Vdd. To compensate for supply voltage variations, a circuit 6 is used that provides for the generation of a signal Scomp which results from the multiplication of the signal SD by a digital signal Vdig derived from the digital conversion of the supply voltage Vdd. In particular the circuit 6 includes an analog-digital converter 60 that converts the voltage Vdd into a digital signal Vdig, a circuit block 61 capable of inverting the signal Vdig and of multiplying it by a constant K, and another block 62 capable of multiplying the digital signal K/Vdig by the signal SD, thus obtaining the digital signal Scomp for feeding into the circuit block 3.

The block 61 can be structured as a look-up table (LUT) that contains a map of digital values K/Vdig or a suitable circuit that carries out the inversion in real time of the digital signal K/Vdig. The two solutions for making the block 61 are costly in terms of the digital resources required, given that a large occupation of silicon area is necessary in the integrated circuits.

BRIEF SUMMARY

In view of the state of the art, the present disclosure provides a control apparatus for a supply device for a load, of less circuit complexity than the known apparatuses, and minimizing the use of semiconductor chip area.

In accordance with the present disclosure, a control apparatus for a supply device of a load is provided, said supply device being of the switching type and being connected between a supply voltage and a reference voltage. The apparatus has a sigma-delta device having an input terminal at which a first digital signal is present, and being suitable for producing a pulse-density modulation signal at the output terminal. The sigma-delta device has a feedback circuit suitable for sending to the input terminal of the sigma-delta device a signal whose value depends on the value of the output signal. The apparatus includes a circuit suitable for digitalizing the supply voltage, thus providing a further digital signal. The feedback circuit includes a terminal suitable for receiving the further digital signal, the sigma-delta device having a gain such that the digital output signal is proportional to the inverse of the further digital signal.

In accordance with the present disclosure, a semiconductor device is provided that includes a control apparatus of a supply device of a load, the control apparatus integrated into the semiconductor device and including a sigma-delta device having an input terminal at which a first digital signal is present and structured to produce a pulse density modulation signal at the output terminal, the sigma-delta device having a feedback circuit coupled to the input terminal of the sigma-delta device to send a second digital signal whose value depends on the value of the output signal, the apparatus further including a circuit adapted to digitalize the supply voltage and provide a further digital signal, the feedback circuit comprising a terminal to receive the further digital signal, the sigma-delta device having a gain such that the digital output signal is proportional to the inverse of the further digital signal.

In accordance with another aspect of the foregoing semiconductor device, the device includes a device wherein the feedback circuit comprises a device to supply the second digital signal with a value equal to 0 or the value of the further digital signal if respectively the value of the digital signal at the output from the sigma-delta device has respectively a value of 1 or 0, said second digital signal being subtracted from the first digital signal to provide a third digital signal, the sigma-delta device comprising an integrator structured to integrate the third digital signal and a comparator structured to compare the digital signal at the output of the integrator with the further digital signal to provide the output signal of the sigma-delta device with a value 1 if the digital signal at the output of the integrator is lower than the further digital signal and with a value 0 if the digital signal at the output of the integrator is equal to the further digital signal.

In accordance with the present disclosure, a circuit is provided that includes a first device having an input to receive a first digital signal and to generate a pulse density modulation signal or an output, the first device comprising a feedback circuit coupled between the output and input of the first device and structured to generate a second digital signal responsive to the pulse density modulation signal; and a converter circuit coupled to the feedback circuit and structured to provide a further digital signal to the feedback circuit.

In accordance with another aspect of the circuit described above, the converter includes an analog-to-digital converter circuit structured to convert an analog supply voltage to the further digital signal. Ideally the first device comprises a sigma-delta converter.

In accordance with another aspect of the foregoing circuit, it further includes a switching device coupled to the input of the first device and structured to supply the second digital signal with a value of 0 when the value of the pulse density modulation signal has a value of 1, and to supply the second digital signal with a value of the further digital signal when the value of the pulse density modulation signal has a value of 0.

In accordance with another aspect of the foregoing embodiment, the first device includes an integrator circuit coupled to a subtractor circuit to integrate a third digital signal that is the result of a subtraction of the second digital signal from the first digital signal, the integrator circuit outputting an integration of the third digital signal to a comparator circuit that compares the integration of the third digital signal with the further digital signal and to provide the pulse density modulation signal with a value of 1 if the value of the integration of the third digital signal is less than the further digital signal and to provide the pulse density modulation signal with a value of 0 if the integration of the third digital signal is equal to the further digital signal.

In accordance with another aspect of the present disclosure, a control circuit is provided for an apparatus that is coupled to a supply device that receives a supply voltage, the control circuit including an analog-to-digital converter structured to convert the supply voltage to a digital supply signal; a sigma-delta circuit having an input coupled to an output of the analog-to-digital converter to receive the digital supply signal, the sigma-delta circuit comprising a switching device having an input to receive the digital supply signal and an output coupled to a differentiator node at which a first digital signal is supplied, an output of the differentiator node coupled to an input of an integrator comprising a latch circuit that is provided with a clock signal, an output of the latch circuit coupled to a comparator to compare the output of the latch circuit with the digital supply signal and to output a pulse density modulation signal.

In accordance with another aspect of the foregoing embodiment, the control circuit includes a feedback loop coupled between the output of the latch circuit and an input node that is coupled to the input of the latch circuit to combine the output of the latch circuit with the output of the differentiator node.

In accordance with a further aspect of the foregoing embodiment, the switching device is configured to receive on a first input the pulse density modulation signal, on a second input the digital supply signal, and on a third input a 0 value signal, the switching device configured to output to the differentiator node with a value equal to 0 when the value of the pulse with modulation signal is a 1 or to output the value of the digital supply signal when the pulse with modulation signal is a 0, the differentiator node subtracting the output of the switching device from the first digital signal to provide an output to the summing node preceding the latch circuit.

In accordance with yet a further aspect of the foregoing embodiment, the sigma-delta circuit is configured to compare the output of the latch circuit with the digital supply signal and to provide the pulse density modulation signal with a value of 1 when the output of the latch circuit is lower than the digital supply signal and to provide a value of 0 if the output of the latch circuit is equal to the digital supply signal.

BRIEF DESCRIPTION OF THE SEVERAL VIEWS OF THE DRAWINGS

The characteristics and advantages of the present disclosure will become evident from the following detailed description of practical embodiments thereof, which are illustrated by way of non-limiting example in the attached drawings, in which.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures or components or both associated with motors and switching devices, including but not limited to coils, rotors, stators, and well-known components thereof have not been shown or described in order to avoid unnecessarily obscuring descriptions of the embodiments.

Unless the context requires otherwise, throughout the specification and claims that follow, the word "comprise" and variations thereof, such as "comprises" and "comprising" are to be construed in an open inclusive sense, that is, as "including, but not limited to." The foregoing applies equally to the words "including" and "having."

Reference throughout this description to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
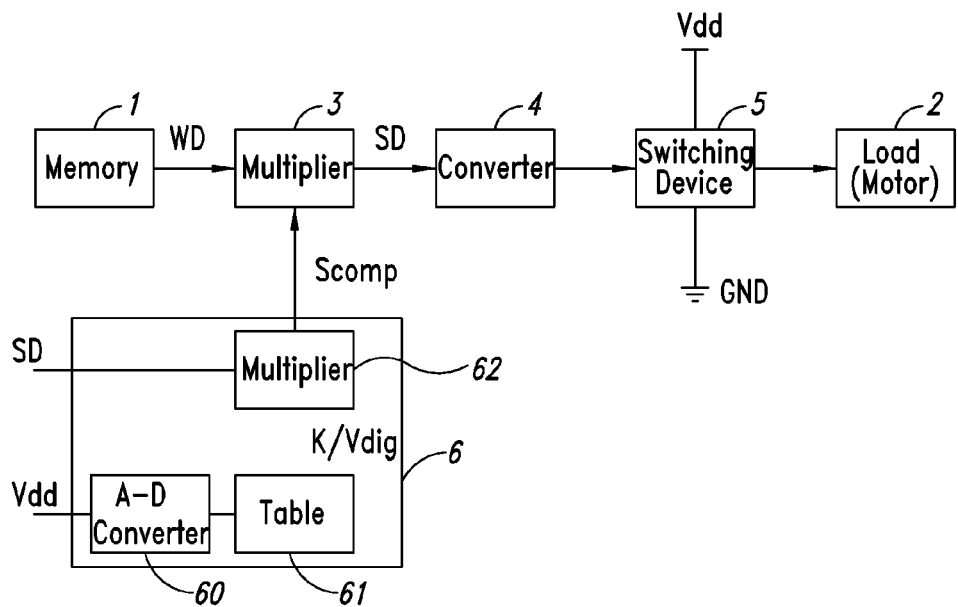
FIG. 1 shows the scheme of a control apparatus for a motor of a digital type.
Figure 2:
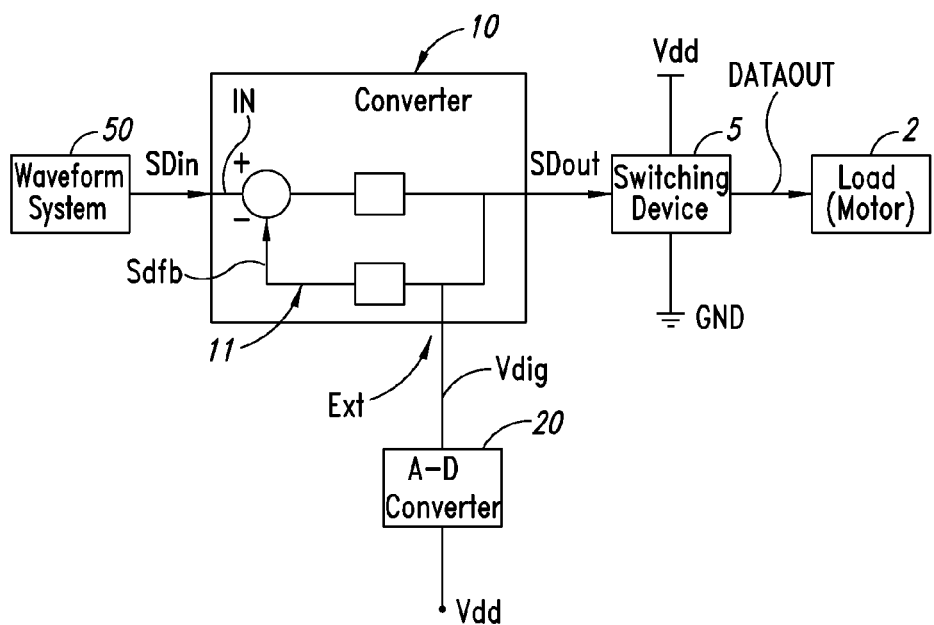
FIG. 2 shows a scheme of a control apparatus for a supply device of a load in accordance with the present disclosure.

With reference to FIG. 2, a schematic is shown of a control apparatus for a supply device of a load in accordance with the present disclosure. The apparatus includes a sigma-delta converter 10 capable of converting to a pulse-density modulation digital signal SDout the digital signal SDin present at the input terminal IN and generated by a system 50 for generating digital waveforms. The signal SDout is capable of controlling a switching device 5 connected to a supply voltage Vdd and to a reference voltage, for example ground GND, and it is capable of supplying a load 2 by means of a signal DATAOUT. The converter 10 includes a feedback circuit 11 adapted to provide a signal SDfb at the input terminal IN in response to the value of the output signal SDout. The feedback circuit 11 has a terminal Ext for the input of a digital signal Vdig corresponding to the supply voltage Vdd digitalized by means of an analog-digital converter 20. The converter 10 has a gain G such that the digital output signal SDout is proportional to the inverse of the digital signal Vdig.

In other words, the digital signal SDin being an N-bit number between 0 and $((2^N)-1)$, where N is a whole number, and a digital signal Sdout being a string of ones and zeros, the density of the ones in the signal SDout depends on the value SDin with a gain proportional to 1/Vdig.

Figure 3:
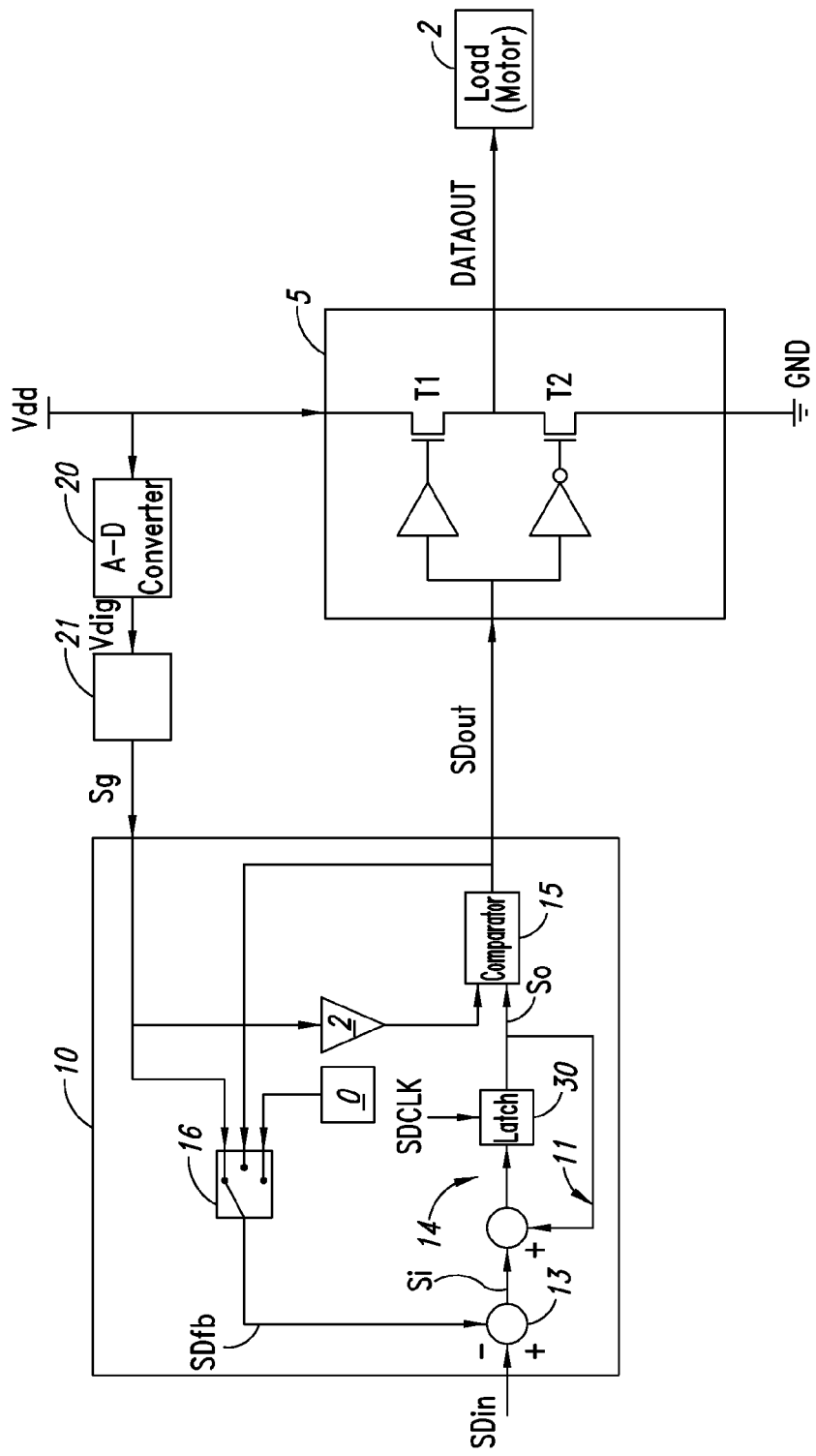
FIG. 3 shows a scheme in more detail of the control apparatus for a supply device of a load shown in FIG. 2.

More particularly, as may be seen in FIG. 3, the sigma-delta converter 10 includes a differentiator node 13, an integrator 14, a comparator 15 and a two way digital switch 16. The two way digital switch commutes between two values, either 0 or the signal Sg; the signal Sg is proportional to the signal Vdig and is taken by means of a block 21 to a bit value of $((2^P)-1)$. In the event of fixed gain the result is that the signal $Sg=((2^N)-1)$, where N is the number of bits of the input signal SDin. The input signal SDin has the signal SDfb, at the output from the two way digital switch 16, subtracted from it by means of the differentiator 13, obtaining a signal Si applied at the input of the integrator 14.

At the start the output signal Sdout=1, and this makes the two way digital switch 16 commutes to the value 0 at the output, so that at the differentiator node 13 the value 0 is subtracted from the input signal SDin; the integrator 14 continues to add the input values together, for example by means of a latch 30 provided by a clock SDCLK, until its output reaches a value of $2*((2^N)-1)$. At this point the comparator 15, which compares the signal So at the output of the integrator 14 with the signal Sg2=2*Sg (the signal Sg multiplied by two as shown in FIG. 3), changes the value of the signal SDout which becomes 0, and that makes the output of the two way digital switch 16 commutes to the value ((2^N)−1). At the differentiator node 13, the value ((2^N)−1) is subtracted from the input signal SDin, and when the output of the integrator 14 returns to a value lower than 2*((2^N)−1) the comparator 15 takes the output SDout to the value 1, and so forth. The output SDout is therefore a bit stream signal whose density of 1 is proportional to the input value, i.e. to the value SDin.

If the fixed value Sg=((2^N)−1) is replaced with the real value of the signal Sg, we get the result that the pulse-density modulation signal SDout at the output of the sigma-delta converter 10 will be compensated against variation in the supply voltage Vdd.

The supply device 5 preferably includes at least one half-bridge of transistors T1 and T2, connected between the supply voltage Vdd and ground GND; the load 2 is connected to the terminal in common between transistors T1 and T2.

In the event that the control apparatus in accordance with the disclosure is used for controlling an electric motor, normally laid out as a series of three inductances and three resistances connected in the form of a star in which the I phase currents circulate, the device 5 comprises three transistor half-bridges driven by three sigma-delta converters 10 having at the input the same signal Sg.

Figure 4:
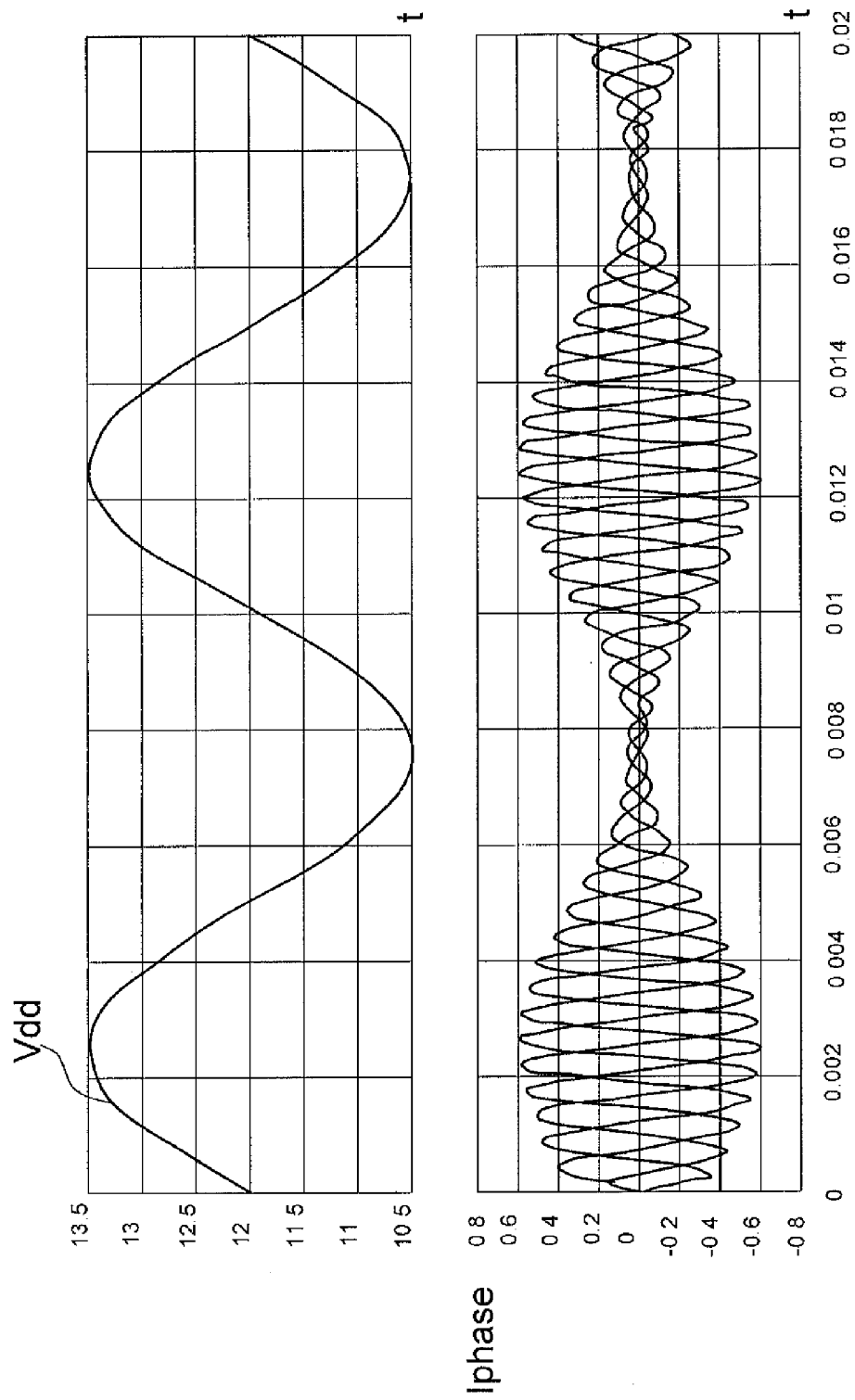
FIG. 4 shows a time diagram of the supply voltage and the currents in the case of a control apparatus for an electric motor without compensation at the supply voltage variations.
Figure 5:
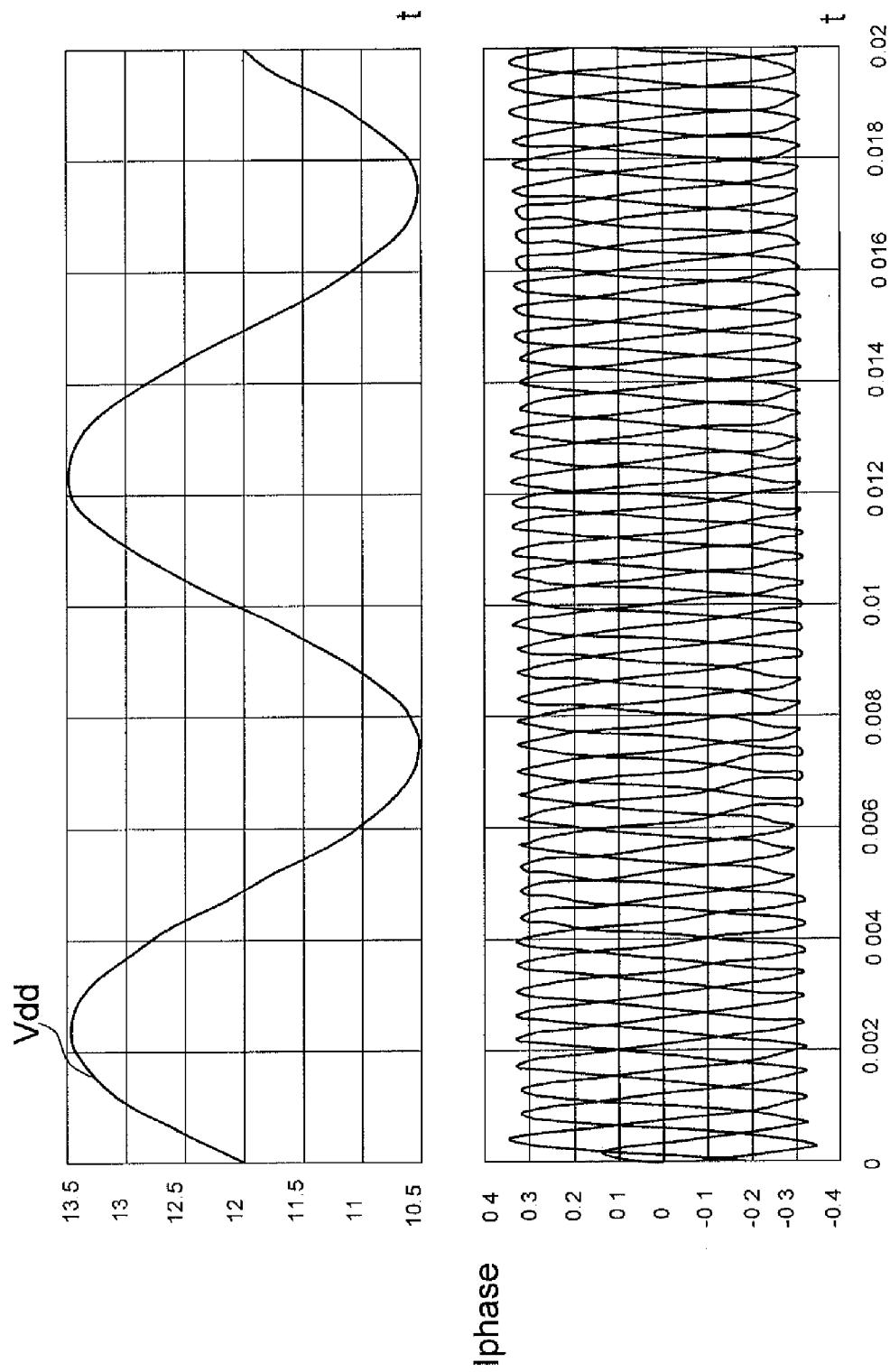
FIG. 5 shows a time diagram of the supply voltage and the currents in the case of a control apparatus for an electric motor in accordance with the disclosure.

FIG. 4 shows a time diagram of the supply voltage Vdd, having a nominal value of 12V but variable in a range from 10.5 to 13.5V, and of the I phase currents in the case of a control apparatus for an electric motor of known type, without compensation for variations in the supply voltage. FIG. 5 shows a time diagram of the supply voltage Vdd, having a nominal value of 12V but variable in a range from 10.5 to 13.5V, and of the I phase currents in the case of a control apparatus for a supply device for an electric motor in accordance with the invention; note that the I phase currents do not vary with variation of the supply voltage Vdd.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A control apparatus to control a supply device, the apparatus comprising:
a digitizer circuit adapted to digitize a supply voltage and provide a first digital signal; and
a sigma-delta device having an input terminal configured to receive a second digital signal and produce a pulse density modulation signal at an output terminal of the sigma-delta device, the sigma-delta device including a feedback circuit coupled to the input terminal of the sigma-delta device and configured to send a third digital signal having a value that depends on a value of the pulse density modulation signal, the feedback circuit including a terminal to receive the first digital signal, the sigma-delta device having a gain and configured to produce the pulse density modulation signal proportional to the inverse of the first digital signal, the feedback circuit including a device structured to supply the third digital signal with a first value or the value of the further digital signal if respectively the value of the pulse density signal at the output from the sigma-delta device has respectively a second value or the first value, a subtractor structured to subtract the third digital signal from the second digital signal to provide a fourth digital signal, the sigma-delta device further including an integrator structured to integrate the fourth digital signal and a comparator structured to compare a digital output signal at an output of the integrator with the first digital signal to provide the pulse density modulation signal of the sigma-delta device with the second value if the digital output signal at the output of the integrator is lower than the first digital signal and with the first value if the digital output signal at the output of the integrator is equal to or greater than the further digital signal.

2. The apparatus of claim 1 wherein the first value is 0 and the second value is 1.

3. A semiconductor device, comprising: a control apparatus to control a supply device for a load, the control apparatus integrated into the semiconductor device and including a sigma-delta device having an input terminal to receive a first digital signal and structured to produce a pulse density modulation signal at an output terminal, the sigma-delta device further having a feedback circuit coupled to the input terminal of the sigma-delta device and structured to send a second digital signal whose value depends on the value of the output signal, the control apparatus further including a digitizer circuit structured to digitalize the supply voltage and provide a further digital signal, the feedback circuit having a terminal to receive the further digital signal, the sigma-delta device structured to have a gain such that the digital output signal is proportional to an inverse of the further digital signal, the feedback circuit including a device to supply the second digital signal with a first value or the value of the further digital signal if respectively the value of the pulse density modulation signal at the output from the sigma-delta device has respectively a second value or the first value, and a subtractor structured to subtract the second digital signal from the first digital signal to provide a third digital signal, the sigma-delta device further including an integrator structured to integrate the third digital signal and a comparator structured to compare a digital output signal at an output of the integrator with the further digital signal to provide the pulse density modulation signal of the sigma-delta device with the second value if the digital signal at the output of the integrator is lower than the further digital signal and with the first value if the digital output signal at the output of the integrator is equal to the further digital signal.

4. The semiconductor device of claim 3 wherein the first value is 0 and the second value is 1.

5. A circuit comprising:
a first device having an input structured to receive a first digital signal and to generate a pulse density modulation signal on an output, the first device comprising a feedback circuit coupled between the output and the input of the first device and structured to generate a second digital signal responsive to the pulse density modulation signal;

a converter circuit coupled to the feedback circuit and structured to provide a further digital signal to the feedback circuit; and further including a switching device coupled to the input of the first device and structured to supply the second digital signal with a first value when the value of the pulse density modulation signal has a second value, and to supply the second digital signal with a value of the further digital signal when the value of the pulse density modulation signal has the first value.

6. The circuit of claim 5 wherein the converter circuit includes an analog-to-digital converter structured to convert an analog supply voltage to the further digital signal.

7. The circuit of claim 5 wherein the first device includes a sigma-delta converter.

8. The circuit of claim 5 wherein the first value is 0 and the second value is 1.

9. The circuit of claim 5 wherein the first device includes an integrator circuit coupled to a subtractor circuit and structured to integrate a third digital signal that is the result of a subtraction of the second digital signal from the first digital signal, the integrator circuit structured to output an integration of the third digital signal to a comparator circuit that is structured to compare the integration of the third digital signal with the further digital signal and to provide the pulse density modulation signal with the second value if the value of the integration of the third digital signal is less than the further digital signal and to provide the pulse density modulation signal with the first value if the integration of the third digital signal is equal to the further digital signal.

10. The circuit of claim 5, further including a switching device coupled to the first device to receive the pulse density modulation signal and to generate on an output a supply signal.

11. The circuit of claim 10 wherein the switching device is coupled to a motor to provide the supply signal to the motor.

12. A control circuit for an apparatus that is coupled to a supply device that receives a supply voltage, the control circuit comprising:
an analog-to-digital converter structured to convert the supply voltage to a digital supply signal;
a sigma-delta circuit having an input coupled to an output of the analog-to-digital converter and structured to receive the digital supply signal, the sigma-delta circuit including a switching device having a first input structured to receive the digital supply signal and to output a first digital signal on an output coupled to a differentiator, the differentiator having an output coupled to an input of an integrator, the integrator including a latch circuit that is provided with a clock signal and an output coupled to a comparator that is structured to compare an output of the latch circuit with the digital supply signal and to output a pulse density modulation signal.

13. The circuit of claim 12, comprising a feedback loop coupled between the output of the latch circuit and an input node that is coupled to the input of the latch circuit and structured to combine the output of the latch circuit with the output on the differentiator.

14. The circuit of claim 13 wherein the switching device is structured to receive on the first input the pulse density modulation signal, on a second input the digital supply signal, and on a third input a 0 value signal, and to output to the differentiator a value equal to 0 when the value of the pulse with modulation signal is a 1 and to output the value of the digital supply signal when the pulse with modulation signal is a 0, the differentiator structured to subtract the output of the switching device from the first digital signal to provide an output to a summing node preceding the latch circuit.

15. The circuit of claim 14 wherein the sigma-delta circuit is configured to compare the output of the latch circuit with the digital supply signal and to provide the pulse density modulation signal with a value of 1 when the output of the latch circuit is lower than the digital supply signal and to provide a value of 0 if the output of the latch circuit is equal to the digital supply signal.

16. A system, comprising:
a motor;
a voltage supply device;
an analog-to-digital converter structured to convert a supply voltage from the voltage supply device to a digital supply signal; and
a sigma-delta circuit having an input coupled to an output of the analog-to-digital converter and structured to receive the digital supply signal, the sigma-delta circuit including a switching device having a first input structured to receive the digital supply signal and to output a first digital signal on an output coupled to a differentiator, the differentiator having an output coupled to an input of an integrator, the integrator including a latch circuit that is provided with a clock signal and an output coupled to a comparator that is structured to compare an output of the latch circuit with the digital supply signal and to output a pulse density modulation signal.

17. The system of claim 16, comprising a feedback loop coupled between the output of the latch circuit and an input node that is coupled to the input of the latch circuit and structured to combine the output of the latch circuit with the output on the differentiator.

18. The system of claim 17 wherein the switching device is structured to receive on the first input the pulse density modulation signal, on a second input the digital supply signal, and on a third input a 0 value signal, and to output to the differentiator a value equal to 0 when the value of the pulse density modulation signal is a 1 and to output the value of the digital supply signal when the pulse density modulation signal is a 0, the differentiator structured to subtract the output of the switching device from the first digital signal to provide an output to a summing node preceding the latch circuit.

19. The system of claim 18 wherein the sigma-delta circuit is configured to compare the output of the latch circuit with the digital supply signal and to provide the pulse density modulation signal with a value of 1 when the output of the latch circuit is lower than the digital supply signal and to provide a value of 0 if the output of the latch circuit is equal to the digital supply signal.

\* \* \* \* \*